(12) United States Patent
Arai et al.

(10) Patent No.: US 6,891,438 B2
(45) Date of Patent: May 10, 2005

(54) ADAPTIVE ACTIVE BIAS COMPENSATION TECHNIQUE FOR POWER AMPLIFIERS

(75) Inventors: George T. Arai, Escondido, CA (US); Michael C. Denny, San Diego, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 125 days.

(21) Appl. No.: 10/319,255

(22) Filed: Dec. 12, 2002

(65) Prior Publication Data

US 2004/0113700 A1 Jun. 17, 2004

(51) Int. Cl.[7] .............................. H03F 3/04; H03G 3/10; H03G 3/20
(52) U.S. Cl. .................. 330/296; 330/285; 330/136
(58) Field of Search .................. 330/296, 285, 330/136

(56) References Cited

U.S. PATENT DOCUMENTS

| | | | | |
|---|---|---|---|---|
| 4,755,741 A | * | 7/1988 | Nelson | 323/289 |
| 4,857,861 A | * | 8/1989 | Seevinck et al. | 330/255 |
| 5,982,236 A | * | 11/1999 | Ishikawa et al. | 330/296 |
| 6,025,754 A | * | 2/2000 | Czora | 330/296 |
| 6,614,309 B1 | * | 9/2003 | Pehlke | 330/296 |

* cited by examiner

*Primary Examiner*—Patricia Nguyen
(74) *Attorney, Agent, or Firm*—John A. Miller; Warn, Hoffmann, Miller & LaLone, P.C.

(57) ABSTRACT

A power amplifier circuit (10) for a TDMA transmitter. The amplifier circuit (10) includes an FET amplifier (14), a current sensing resistor (24) that senses the quiescent drain current of the FET amplifier (14), and a switch (26) coupled across the sensing resistor (24). When data transmission bursts are being amplified by the amplifier circuit (10), a switch signal closes the switch (26) to bypass the sensing resistor (24) so that it does not dissipate power and reduce the efficiency of the amplifier circuit (10). When the data transmission is between data bursts, the switch signal opens the switch (26) to allow a voltage drop across the sensing resistor (24). The voltage drop is measured to determine the quiescent drain current of the FET amplifier (14) to maintain the drain current at the desirable operating point.

27 Claims, 1 Drawing Sheet

ADAPTIVE ACTIVE BIAS COMPENSATION TECHNIQUE FOR POWER AMPLIFIERS

BACKGROUND OF THE INVENTION

1. Field of the Invention

This invention relates generally to a power amplifier circuit employing a technique for maintaining the amplifier's operating point constant over time and, more particularly, to a power amplifier circuit employing a current sensing resistor that is switched into the power amplifier circuit when the amplifier circuit is in a quiescent state to measure and maintain the small signal gain and linearity of the amplifier constant over time.

2. Discussion of the Related Art

Communications systems that transmit RF signals carrying information typically employ power amplifiers to amplify the transmit signal so that it has enough power to be received and deciphered by a receiver at a distant location. Digital communication systems of this type typically have highly complex and highly precise modulation waveforms in order to maximize utilization and revenue from precisely assigned radio frequency band allocations. Thus, the specifications of a digital communications system and its associated components usually are very strict. For example, precise spectral control must be maintained in the system over varying operating conditions and environments and over the system life.

Power amplifiers are among the most critical components of a digital communications system because they directly affect the linearity, distortion and spectral control of the transmit signal. Nonlinearities within the power amplifier introduce signal harmonics, inter-modulation products and other distortions and spurious counterparts of the RF signal being transmitted that cause interfering signals to other frequency channels. Additionally, the power amplifiers must maintain a constant small signal gain (SSG) despite the fluctuations in loading, drive and device aging that may act on the amplifier. In particular, for the commonly employed laterally diffused metal oxide semiconductor (LDMOS) transistor amplifier, the SSG will vary as the quiescent drain current of the amplifier changes due to amplifier aging and temperature changes.

Because it is necessary that the SSG performance of a power amplifier remains constant over the transmitter circuit lifetime, which may be years, various techniques are known in the art to ensure that the SSG remains constant. For example, because most of the drift in the quiescent drain current of the amplifier occurs during the initial 10–20 hours of operation, it is known in the art to set the quiescent drain current of the amplifier at a value higher than the desired operation point of the amplifier, and then allow the quiescent current to drift into the nominal operating condition after several hours of operation. However, not only will the power amplifier circuit operate outside of its desired operating point at the beginning of the amplifier's life when the drift in the quiescent current is greatest, the amplifier quiescent current will also continue to drift past the desired operating point towards the end of its useful life. This results in a less than optimum performance at the beginning and towards the end of the amplifier's life.

It has heretofore also been known to "bum in" an amplifier at the beginning to allow the quiescent drain current of the amplifier to stabilize prior to setting the operating point of the amplifier. However, this is an expensive alternative in a high volume production environment because many amplifiers are required to be burned in for several hours, significantly increasing cost of production. Also, the "bum in" technique does not affect the drift of the SSG towards the end of the amplifier's useful life.

Some amplifier circuits employ active DC bias compensation to maintain the SSG constant throughout the life of the amplifier. For example, some power amplifier circuits incorporate a low value sensor resistor in series with the drain or collector supply of the output of the transistor amplifier. The resistor is typically part of a current mirror within a feedback loop in the amplifier circuit that sets the gate voltage of the transistor amplifier, or base current for bipolar applications, which sets the quiescent drain current of the transistor amplifier. Alternatively, the amplifier circuit may employ an analog-to-digital (A/D) converter to measure the voltage across the sensor resistor, and a microcontroller to set the gate voltage, and hence the quiescent drain current of the transistor amplifier.

Due to the small value of the sensor resistor, these amplifier circuits employing an active DC bias typically have poor accuracy. A larger sensor resistor improves accuracy, but degrades the efficiency of the amplifier circuit during operation due to the power dissipated in the sensor resistor. In the case of the more elaborate approach of using A/D converters and microcontrollers, the cost of monitoring, measuring and controlling the quiescent drain current while the power amplifier is in operation is difficult and expensive. In all cases, the sensor resistor reduces the maximum output power of the amplifier, thereby degrading the linearity of the amplifier.

SUMMARY OF THE INVENTION

In accordance with the teachings of the present invention, a power amplifier circuit is disclosed for a TDMA transmitter. The amplifier circuit employs an FET amplifier and a current sensing element, such as a resistor, that senses the quiescent drain current of the amplifier. The amplifier circuit also includes a switch coupled across the current sensing resistor that is responsive to a switch signal identifying when TDMA data transmission bursts are being amplified by the amplifier circuit. When the data transmission bursts are being amplified by the amplifier circuit, the switch signal closes the switch to bypass the current sensing resistor so that it does not dissipate power and reduce the efficiency and linearity of the amplifier circuit during data transmission. When the data transmission is between bursts, the switch signal opens the switch to provide a voltage potential across the sensing resistor that is indicative of the quiescent drain current of the FET amplifier. The sensed voltage is applied to a gated sample and hold circuit that compares the sensed voltage to a reference voltage. In one embodiment, the sensed voltage is level translated prior to being applied to the sample and hold circuit. The difference between the reference voltage and the sensed voltage is used to adjust a DC bias signal applied to the gate terminal of the FET amplifier to maintain the drain current or SSG of the amplifier at the desirable operating point over time.

Additional objects, advantages and features of the present invention will become apparent from the following description and appended claims, taken in conjunction with the accompanying drawings.

DETAILED DESCRIPTION OF THE EMBODIMENTS

Figure 1:
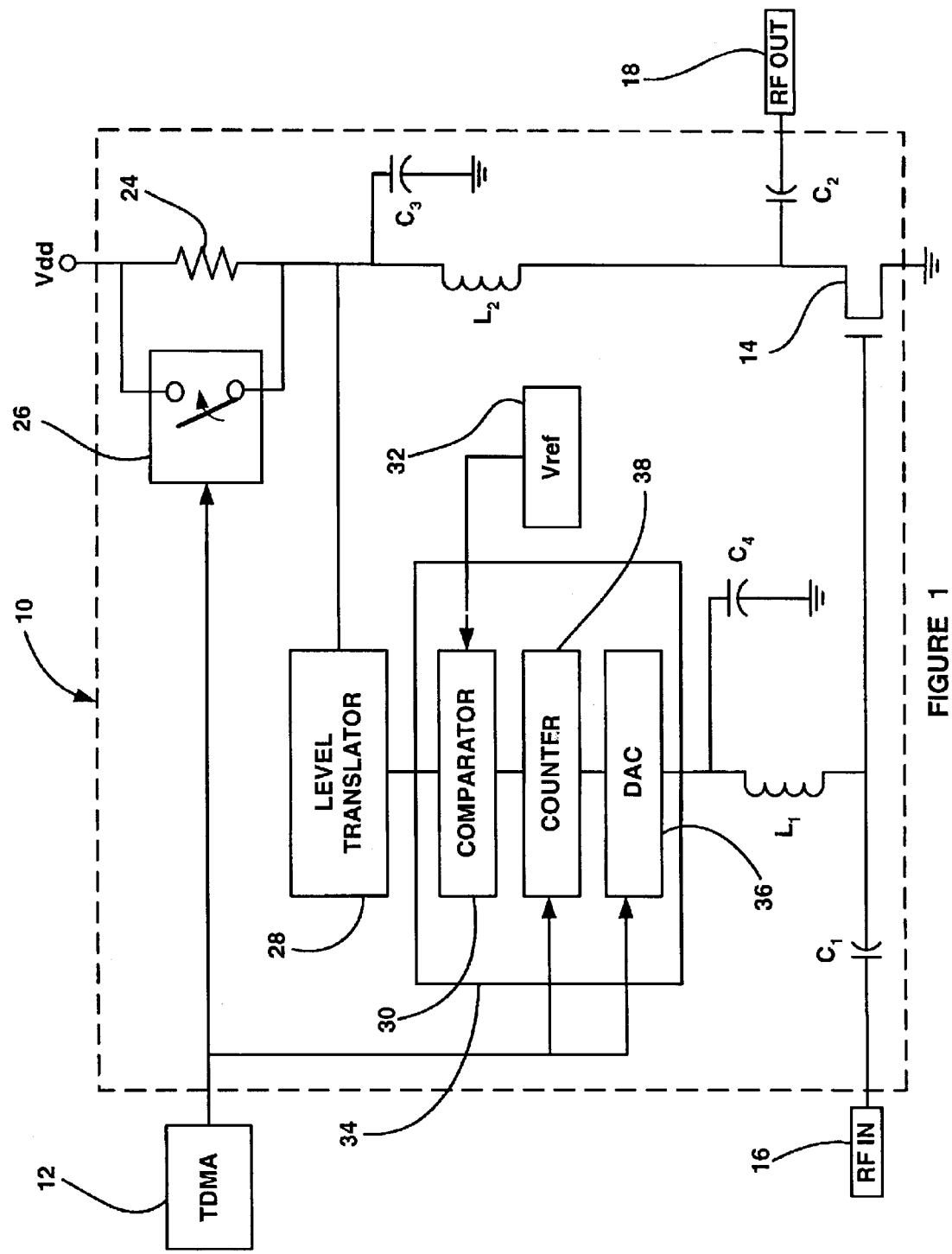
FIG. 1 is a schematic block diagram of a power amplifier circuit employing a current sensing resistor, according to an embodiment of the present invention.

The following discussion of the embodiments of the invention directed to a power amplifier circuit that provides selective quiescent drain current sensing at the drain terminal of an MOSFET amplifier is merely exemplary in nature, and is in no way intended to limit the invention or its applications or uses.

FIG. 1 is schematic block diagram of a power amplifier circuit 10, according to an embodiment of the present invention. The amplifier circuit 10 can be employed in a transmitter associated with a digital communications system, and particularly a time division multiple access (TDMA) digital communications system, where packets of digital data are transmitted in bursts as determined by a TDMA coding system, as is well understood to those skilled in the art. In the amplifier circuit 10, a TDMA digital base-band circuit of the transmitter is represented at reference number 12. The TDMA circuit 12 provides a signal to the amplifier circuit 10 indicating when the transmitter is transmitting data, and when the transmitter is in a quiescent state between data transmission bursts.

The amplifier circuit 10 includes a power amplifier 14 that amplifies an RF signal including digital data modulated thereon applied to an RF input port 16. The amplified RF signal is output on an RF output port 18 to be transmitted. Capacitors $C_1$ and $C_2$ are DC blocking capacitors that prevent DC signals in the circuit 10 from propagating into the ports 16 and 18. Capacitors $C_3$ and $C_4$ are filtering capacitors that reduce switching noise. In this embodiment, the power amplifier 14 is an LDMOS field effect transistor (FET) amplifier, well known to those skilled in the art. However, in other embodiments, the amplifier 14 may be other FETs, such as metal semiconductor field effect transistors (MESFETs), junction field effect transistors (JFETs), GaAs FETs, as well as bipolar transistors. The RF signal to be amplified is applied to a gate terminal of the FET amplifier 14 that correspondingly changes the current flow at a drain terminal of the FET amplifier 14 to amplify the signal. The source terminal of the FET amplifier 14 is coupled to ground. Inductors $L_1$ and $L_2$ operate as RF chokes (RFC) that serve to isolate the RF signals from the ports 16 and 18 and the digital portions of the circuit 10.

A DC bias voltage, discussed below, is applied to the gate terminal of the FET amplifier 14 through the inductor $L_1$. According to the invention, the amplifier circuit 10 senses the quiescent current at the drain terminal of the FET amplifier 14 only at those times when no data bursts are being amplified, and thus does not suffer from the limitations of the prior art discussed above. When the quiescent current is measured, it is used to adjust the DC bias applied to the FET amplifier 14 to provide adaptive selection of the DC bias that enables stabilization of the SSG over time, and effectively compensates for the normal aging characteristics due to $V_{gs}$ drift and transistor variations due to temperature. Because the sensing element, discussed below, is by-passed during data bursts, no losses in the DC power distribution is incurred during data transmission. Therefore, maximum DC to RF efficiency is realized.

According to the invention, a current sensing element 24, here a resistor, is employed to provide a voltage drop that is indicative of the drain current of the FET amplifier 14. A switch 26 is provided across the sensing element 24 that acts as a shunt to bypass the current flow around the sensing element 24. The switch 26 can be any switch suitable for the purposes discussed herein, for example, a P-channel MOSFET, a bipolar transistor, or a mechanical relay. As will be discussed in detail below, the switch 26 is closed when the data bursts are being amplified by the circuit 10 so that the current flow travels around the element 24 and there is no voltage drop across the sensing element 24. Between data bursts, the switch 26 is open so that the current flow travels through the sensing element 24 and there is a voltage drop across the sensing element 24 that is indicative of the quiescent current at the drain terminal of the FET amplifier 14. A signal from the TDMA circuit 12 controls the switch 26 so that it is opened and closed at the proper time.

The circuit 10 includes an optional voltage level translator 28 that may be required depending on the DC voltage potential Vdd used by the circuit 10. The level translator 28 can be any circuit suitable for the purposes described herein, such as an active current mirror circuit or a resistive divider network. The level translator 28 provides an equivalent or proportional voltage to that across the sensing element 24 to a voltage level referenced, to ground potential. Particularly, because the sensing element 24 is directly coupled to the DC supply input at Vdd, the voltage at the sensing element 24 may be relatively high, 24–28 volts in one embodiment. However, the DC bias applied to the gate terminal of the FET amplifier 14 may be relatively low, 3–5 volts in one embodiment.

The level translated voltage from the level translator 28 is applied to a gated sample and hold circuit 34. The sample and hold circuit 34 forces the translated voltage as close as possible to a reference voltage from a voltage reference source 32 by a negative feedback through the amplifier circuit 10. The reference voltage can be any convenient level, sourced from a stable source such as a bandgap reference if a constant quiescent current is desired, or a thermally varying source, if gain compensation over temperature is desired. The feedback regulates the current through the sensing element 24, which sets the quiescent drain current of the FET amplifier 14. In this implementation, the TDMA circuit 12 also provides the necessary timing for the transfer of the updated bias levels to the DAC, discussed below. Alternatively, the proper sequencing could be generated internally in the sample and hold circuit 34.

The level translated voltage and the reference voltage are applied to a comparator 30 within the sample and hold circuit 34. The comparator 30 can be any comparator suitable for the purposes described herein. The comparator 30 outputs a logic level that is dependent on the difference between the translated voltage and the reference voltage that is applied to a digital counter 38. In an alternate embodiment, the counter 38 could be replaced with a digital potentiometer.

If the translated voltage is greater than the reference voltage, then the output of the comparator 30 configures the digital counter 38 to be decremented by the TDMA circuit 12. If the translated voltage is less than the reference voltage then the output of the comparator 30 configures the counter 38 to be incremented by the TDMA circuit 12. This allows the circuit 34 to vary the current DC bias signal applied to the gate terminal of the FET amplifier 14 until the desired quiescent drain current at the drain terminal of the FET amplifier 14 is attained based on the relationship of the translated voltage across the sensing element 24 to the reference voltage.

The count value from the counter 38 is applied to a digital-to-analog (DAC) converter 36 that converts the digital count value to an analog signal that represents the new proper DC bias voltage for the FET amplifier 14 that would cause the FET amplifier 14 to generate the desired quiescent drain current or SSG. Changes to the count values occur only between RF transmission bursts. During transmissions, the TDMA circuit 12 prevents the DAC 36 from updating the DC bias, which would otherwise cause distortion. Thus, the sequence of operation of the sample and hold circuit 34 is the comparator 30 first compares the reference voltage to the level translated voltage, then at the next clock cycle the counter 38 is updated, and then at the next clock cycle the DAC 36 is updated, which allows the DAC 36 to update the gate voltage of the FET amplifier 14 between transmission bursts.

In an alternate embodiment, the sample and hold circuit 34 could be an analog system, employing, for example, a loop filter with a switched capacitor type sample and hold device.

Because the sensing element 24 is only switched into the circuit between data bursts, it does not act as a lossy element during data transmission, and does not dissipate power during transmission of data that affects the amplifier circuits efficiency. Because the quiescent drain current is very small, in order to get an accurate representation of the drain current, it would be desirable to provide a large resistor for the sensing element 24 to provide a large voltage drop across it. Therefore, the value of the resistor sensing element 24 can be made larger than those typically employed in the prior art. For example, in the know systems, values on the order of 0.1 ohms or less would be employed as a compromise between being able to sense quiescent currents, which may typically be in the 600 to 800 milliamp range, but not dissipate excessive power during transmission burst where peak currents may typically be in the 6 amp range. In the implementation of the invention, much larger values, such as 1–10 ohms, could be readily used. Because it can be made relatively large, a larger voltage drop is provided across the sensing element 24 which increases the accuracy for providing the desired quiescent drain current. This lessens the sensitivity of the sensing element 24 to noise in the circuit 10. Thus, more accurate sensing of the drain current can be achieved in the amplifier circuit 10 than could be achieved in the known amplifier circuits that employed active current sensing of the quiescent current.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A power amplifier circuit comprising:
    an FET amplifier including a gate terminal, a drain terminal and a source terminal;
    a current sensing element coupled to the drain terminal of the FET amplifier, said current sensing element providing a measured voltage signal indicative of a quiescent drain current of the FET amplifier;
    a switch coupled across the sensing element and being responsive to a switch signal, said switch signal closing the switch to bypass the sensing element when data is being amplified by the FET amplifier and opening the switch to sense the quiescent drain current when data is not being amplified by the FET amplifier; and
    a sample and hold circuit responsive to the measured voltage signal across the sensing element and a reference voltage signal, said sample and hold circuit forcing the measured voltage signal as close as possible to the reference voltage signal by a negative feedback through the amplifier circuit to regulate the current through the sensing element and set the quiescent drain current of the FET amplifier, said sample and hold circuit generating a DC bias voltage that is applied to the gate terminal of the FET amplifier.

2. The power amplifier circuit according to claim 1 wherein the sample and hold circuit is a digital sample and hold circuit.

3. The power amplifier circuit according to claim 2 wherein the sample and hold circuit includes a digital comparator that compares the measured voltage signal to the reference voltage signal, a digital counter responsive to a compared signal from the comparator, said counter being incremented up or down depending on the difference between the voltage signals, and a digital-to-analog converter responsive to a counter signal from the counter, said digital-to-analog converter providing the DC bias voltage.

4. The power amplifier circuit according to claim 2 wherein the sample and hold circuit includes a digital comparator that compares the measured voltage signal to the reference voltage signal, and a digital potentiometer responsive to a compared signal from the comparator, said digital potentiometer providing the DC bias voltage.

5. The power amplifier according to claim 1 wherein the sample and hold circuit is an analog circuit.

6. The power amplifier circuit according to claim 1 wherein the sample and hold circuit is responsive to the switch signal to prevent the sample and hold circuit from changing the DC bias voltage when data is being amplified by the FET amplifier.

7. The power amplifier circuit according to claim 1 further comprising a voltage level translator, said voltage level translator translating the measured voltage signal to a representative voltage signal referenced to ground.

8. The power amplifier circuit according to claim 1 wherein the current sensing element is a resistor.

9. The power amplifier circuit according to claim 8 wherein the resistor has a value in the range of 1–10 ohms.

10. The power amplifier circuit according to claim 1 wherein the switch is selected from the group consisting of a P-channel MOSFET, a bipolar junction transistor and a mechanical relay.

11. The power amplifier circuit according to claim 1 wherein the amplifier circuit is used in connection with a TDMA transmitter, where the switch signal is indicative of when the amplifier circuit is operating between data bursts.

12. A power amplifier circuit for amplifying an RF signal in a TDMA digital communications system, said circuit comprising:
    an FET amplifier including a gate terminal, a drain terminal and a source terminal;
    a current sensing resistor coupled to the drain terminal of the FET amplifier, said current sensing resistor providing a measured voltage signal indicative of a quiescent drain current of the FET amplifier;
    a switch coupled across the sensing resistor and being responsive to a TDMA signal indicative of when the communications system is between data bursts, said switch signal closing the switch to bypass the sensing resistor when data is being amplified by the FET amplifier and opening the switch to sense the quiescent drain current when data is not being amplified by the FET amplifier; and
    a digital sample and hold circuit responsive to the measured voltage signal and a reference voltage signal, said sample and hold signal including a digital comparator that compares the measured voltage signal to the reference voltage signal, a digital counter responsive to a compared signal from the comparator, said counter being incremented up or down depending on the difference between the voltage signals, and a digital-to-analog converter responsive to a counter signal from the counter, said digital-to-analog converter generating a DC bias voltage that is applied to the gate terminal of the FET amplifier to set the quiescent drain current.

13. The power amplifier circuit according to claim 12 further comprising a voltage level translator, said voltage level translator translating the measured voltage signal to a representative voltage signal referenced to ground.

14. The power amplifier circuit according to claim 12 wherein the resistor has a value in the range of 1–10 ohms.

15. The power amplifier circuit according to claim 12 wherein the switch is selected from the group consisting of a P-channel MOSFET, a bipolar junction transistor and a mechanical relay.

16. The power amplifier circuit according to claim 12 wherein the FET amplifier is an LDMOS FET amplifier.

17. A method of maintaining a power amplifier at a desirable operating point, said method comprising:

selectively sensing a quiescent drain current of an FET amplifier only during those times that the amplifier is not amplifying an RF signal, wherein selectively sensing the drain current of an FET amplifier includes providing a switch across the resistor, wherein the switch is closed when the amplifier is amplifying and the switch is open when the amplifier is not amplifying;

comparing the sensed drain current to a reference signal; and adjusting a DC bias voltage applied to a gate terminal of the FET amplifier depending on the difference between the sensed drain current and the reference signal so as to maintain the quiescent drain current of the amplifier constant.

18. The method according to claim 17 wherein selectively sensing the drain current of an FET amplifier includes using a resistor to provide a voltage drop indicative of the drain current.

19. The method according to claim 17 wherein comparing the sensed drain current to a reference signal and adjusting a DC bias voltage applied to a gate terminal of the FET amplifier are performed by a circuit selected from the group consisting of a digital sample and hold circuit and an analog sample and hold circuit.

20. The method according to claim 17 wherein the power amplifier is part of a TDMA transmitter.

21. A power amplifier circuit comprising:

an amplifier;

a current sensing element coupled to the amplifier, said current sensing element providing a measured voltage signal indicative of a quiescent drain current of the amplifier; and a switch coupled across the sensing element and being responsive to a switch signal, said switch signal closing the switch to bypass the sensing element when data is being amplified by the amplifier and opening the switch to sense the quiescent drain current when data is not being amplified by the amplifier.

22. The power amplifier circuit according to claim 21 further comprising a sample and hold circuit responsive to the measured voltage signal across the sensing element and a reference voltage signal, said sample and hold circuit forcing the measured voltage signal as close as possible to the reference voltage signal to regulate the current through the sensing element and set the quiescent drain circuit of the amplifier, said sample and hold circuit generating a DC bias voltage that is applied to the amplifier.

23. The power amplifier circuit according to claim 22 wherein the sample and hold circuit is a digital sample and hold circuit including a digital comparator that compares the measured voltage signal to the reference voltage signal, a digital counter responsive to a compared signal from the comparator, said counter being incremented up or down depending on the difference between the voltage signals, and a digital-to-analog converter responsive to a counter signal from the counter, said digital-to-analog converter providing the DC bias voltage.

24. The power amplifier circuit according to claim 22 wherein the sample and hold circuit is a digital sample and hold circuit that includes a digital comparator that compares the measured voltage signal to the reference voltage signal, and a digital potentiometer responsive to a compared signal from the comparator, said digital potentiometer providing the DC bias voltage.

25. The power amplifier circuit according to claim 22 wherein the sample and hold circuit is an analog circuit.

26. The power amplifier circuit according to claim 21 further comprising a voltage level translator, said voltage level translator translating the measured voltage signal to a representative voltage signal referenced to ground.

27. The power amplifier circuit according to claim 21 wherein the switch is selected from the group consisting of a P-channel MOSFET; a bipolar junction transistor and a mechanical relay.

* * * * *